United States Patent [19]
Ovens et al.

[11] Patent Number: 5,959,502
[45] Date of Patent: Sep. 28, 1999

[54] ANALOG PHASE-LOCKED LOOP INCLUDING VOLTAGE REGULATOR

[75] Inventors: Kevin M. Ovens, Plano; Patrick R. Smith, Garland, both of Tex.

[73] Assignee: Texas Instruments Incorporated, Dallas, Tex.

[21] Appl. No.: 08/995,281

[22] Filed: Dec. 19, 1997

Related U.S. Application Data

[60] Provisional application No. 60/055,821, Aug. 15, 1997, provisional application No. 60/055,856, Aug. 15, 1997, and provisional application No. 60/055,901, Aug. 15, 1997.

[51] Int. Cl.$^6$ .................................................. H03L 7/093
[52] U.S. Cl. ................................. 331/8; 331/17; 331/25; 331/57
[58] Field of Search .................................. 331/8, 17, 25, 331/57

[56] References Cited

U.S. PATENT DOCUMENTS

| | | | |
|---|---|---|---|
| 4,935,941 | 6/1990 | Jones | 375/324 |
| 5,604,466 | 2/1997 | Dreps et al. | 331/25 |
| 5,650,754 | 7/1997 | Joshi et al. | 331/17 |

*Primary Examiner*—Siegfried H. Grimm
*Attorney, Agent, or Firm*—W. Daniel Swayze, Jr.; Wade James Brady, III; Richard L. Donaldson

[57] ABSTRACT

An integrated circuit (100) includes an analog phase-locked loop circuit (10) and other circuitry (102). The integrated circuit (100) has a plurality of external connection pins (104, 106), which are coupled to the other circuitry. The analog phase-locked loop circuit (10) is free of connections to the external connection pins. The analog phase-locked loop circuit (10) includes a phase detector circuit (16) which compares the phase of a reference signal (28) to the output (12) of the phase-locked loop circuit, a charge pump circuit (18) responsive to the phase detector for varying the charge on a capacitor (36) of a loop filter circuit (20), a regulator circuit (22) which receives two separate control voltages (38, 44) from the loop filter circuit, and a voltage controlled oscillator circuit (24) which receives from the regulator circuit two separate control voltages (VIN, VREG) and a regulated supply voltage (VREG).

12 Claims, 2 Drawing Sheets

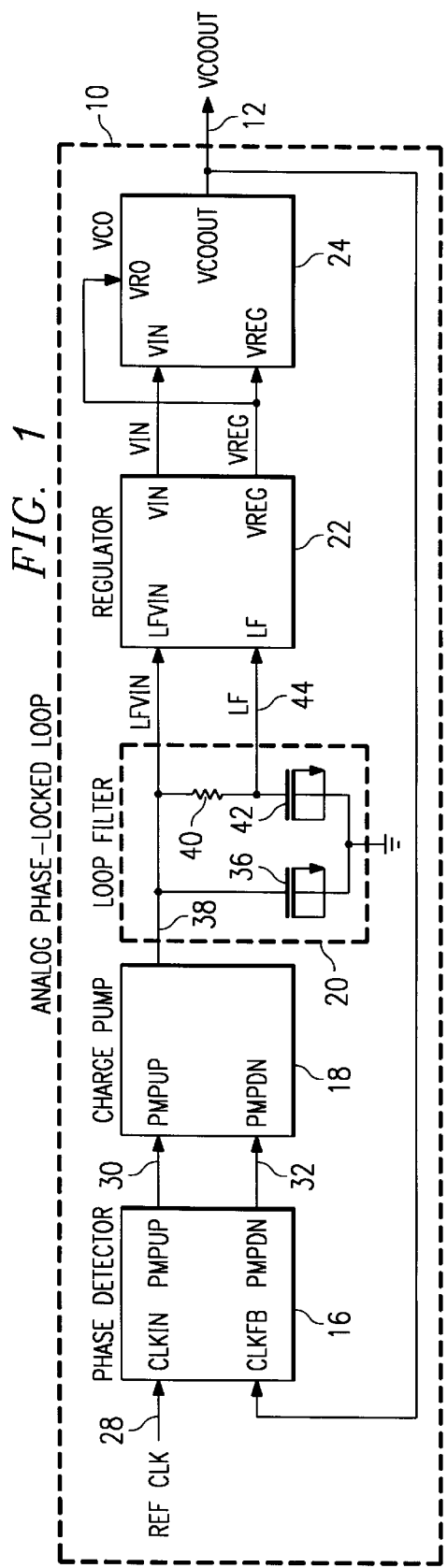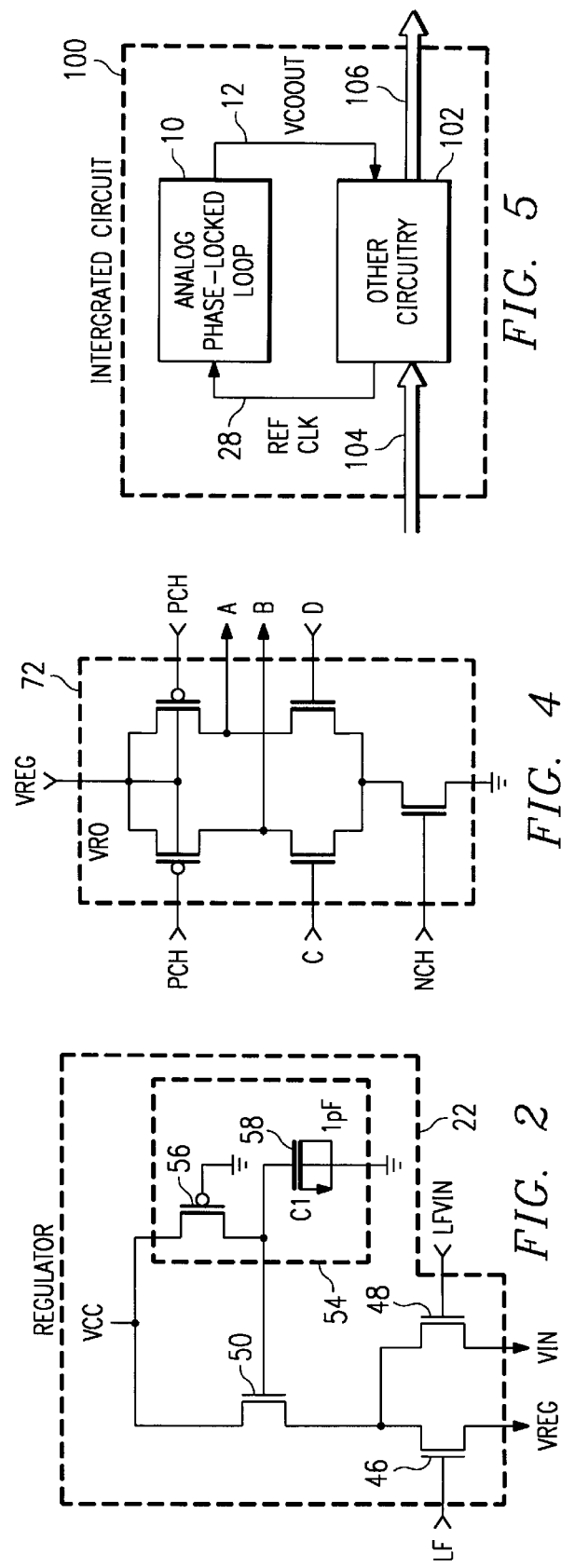

ANALOG PHASE-LOCKED LOOP INCLUDING VOLTAGE REGULATOR

This application claims priority under 35 USC §119(e)(1) of provisional application Ser. No. 60/055,821, 60/055,856, and 60/055,901, all filed Aug. 15, 1997.

CROSS-REFERENCE TO RELATED APPLICATIONS

This application is related to U.S. Ser. No. 08/994,251 filed Dec. 19, 1997 and entitled VOLTAGE REGULATOR CIRCUIT AND PHASE-LOCKED LOOP USING SAME (Attorney Docket No. TI-25807), and is related to U.S. Ser. No.08/994,338 filed Dec. 19, 1997 and entitled METHOD AND APPARATUS FOR EFFECTING ANALOG PHASE-LOCKED LOOP CONTROL OF A SIGNAL FREQUENCY (Attorney Docket No. TI-25808).

TECHNICAL FIELD OF THE INVENTION

This invention relates in general to an analog phase-locked loop and, more particularly, to a method and apparatus for effecting analog phase-locked loop control of a signal frequency with minimal jitter across a wide frequency range.

BACKGROUND OF THE INVENTION

Analog phase-locked loop circuits typically can operate with minimal jitter across just a limited frequency range. Accordingly, it is usually necessary to prepare a number of different circuit designs in order to accommodate different applications requiring operation in different frequency ranges. This is inefficient in terms of design time and product cost, particularly where the phase-locked loop is implemented in an integrated circuit.

A typical analog phase-locked loop circuit includes a phase detector which determines the phase relationship between a reference signal and the output of the phase-locked loop, a charge pump responsive to the phase detector for setting a current or voltage which represents the phase relationship, a low pass filter which has a single cutoff frequency and is responsive to the current or voltage from the charge pump, and a voltage controlled oscillator which generates the output signal from the phase-locked loop circuit and which varies the frequency of the output signal in response to a control voltage from the low pass filter. A voltage regulator may optionally be present in order to provide a regulated supply voltage to the voltage controlled oscillator.

Existing voltage controlled oscillators for analog phase-locked loops have a single control voltage input that varies the frequency of the voltage controlled oscillator. If a wide frequency range is desired, then the voltage controlled oscillator is designed so that the single input has a large gain, expressed in Hertz/volt. However, the larger the gain, the more the jitter induced in the analog phase-locked loop as the charge pump increases and decreases the voltage on the loop filter capacitor.

Where such an analog phase-locked loop is implemented in an integrated circuit, at least three external connection pins of the integrated circuit are dedicated to the analog phase-locked loop circuit. In particular, these three pins provide the analog phase-locked loop circuit with a regulated supply voltage and an associated ground, along with a connection to an external filter circuit to allow limited variation of the frequency characteristics for different applications. It is, of course, desirable in the design of any integrated circuit to reduce the number of external connection pins needed for any circuit section within the integrated circuit. Other important design considerations for integrated circuits are reduction in the area needed to implement a particular circuit function, and reduction in the amount of power consumed by the circuitry implementing a particular function.

SUMMARY OF THE INVENTION

From the foregoing, it may be appreciated that a need has arisen for a method and apparatus for effecting analog phase-locked loop control of a signal frequency, so as to provide stable operation across a wide frequency range, so as to reduce the number of external connection pins needed for implementation in an integrated circuit, and so as reduce the surface area and power consumption needed for implementation in an integrated circuit.

According to the present invention, a method and apparatus are provided to address this need, and involve detecting of a phase relationship between the specified signal and a reference signal; respectively increasing and decreasing a charge on a loop filter capacitor when one of the specified and reference signals respectively has a phase lead and a phase lag relative to the other thereof; applying to an input of a voltage regulator circuit a voltage derived from the voltage on the capacitor; causing the voltage regulator circuit to output oscillator control information which is varied as a function of the voltage at the input to the voltage regulator circuit; supplying the oscillator control information to a voltage controlled oscillator circuit; and causing the voltage controlled oscillator circuit to output a signal which is the specified signal and which has a frequency that is varied as a function of the oscillator control information.

BRIEF DESCRIPTION OF THE DRAWINGS

A better understanding of the present invention will be realized from the detailed description which follows, taken in conjunction with the accompanying drawings, in which:

FIG. 1 is block diagram of an analog phase-locked loop which embodies the present invention;

FIG. 2 is a schematic diagram of a regulator circuit which is a component of the phase-locked loop of FIG. 1;

FIG. 4 is a schematic diagram of one stage of a multi-stage oscillator which is a component of the voltage controlled oscillator of FIG. 3; and FIG. 5 is a block diagram of an integrated circuit which has the analog phase-locked loop of FIG. 1 therein, and also has other circuitry therein.

DETAILED DESCRIPTION OF THE INVENTION

Figure 3:
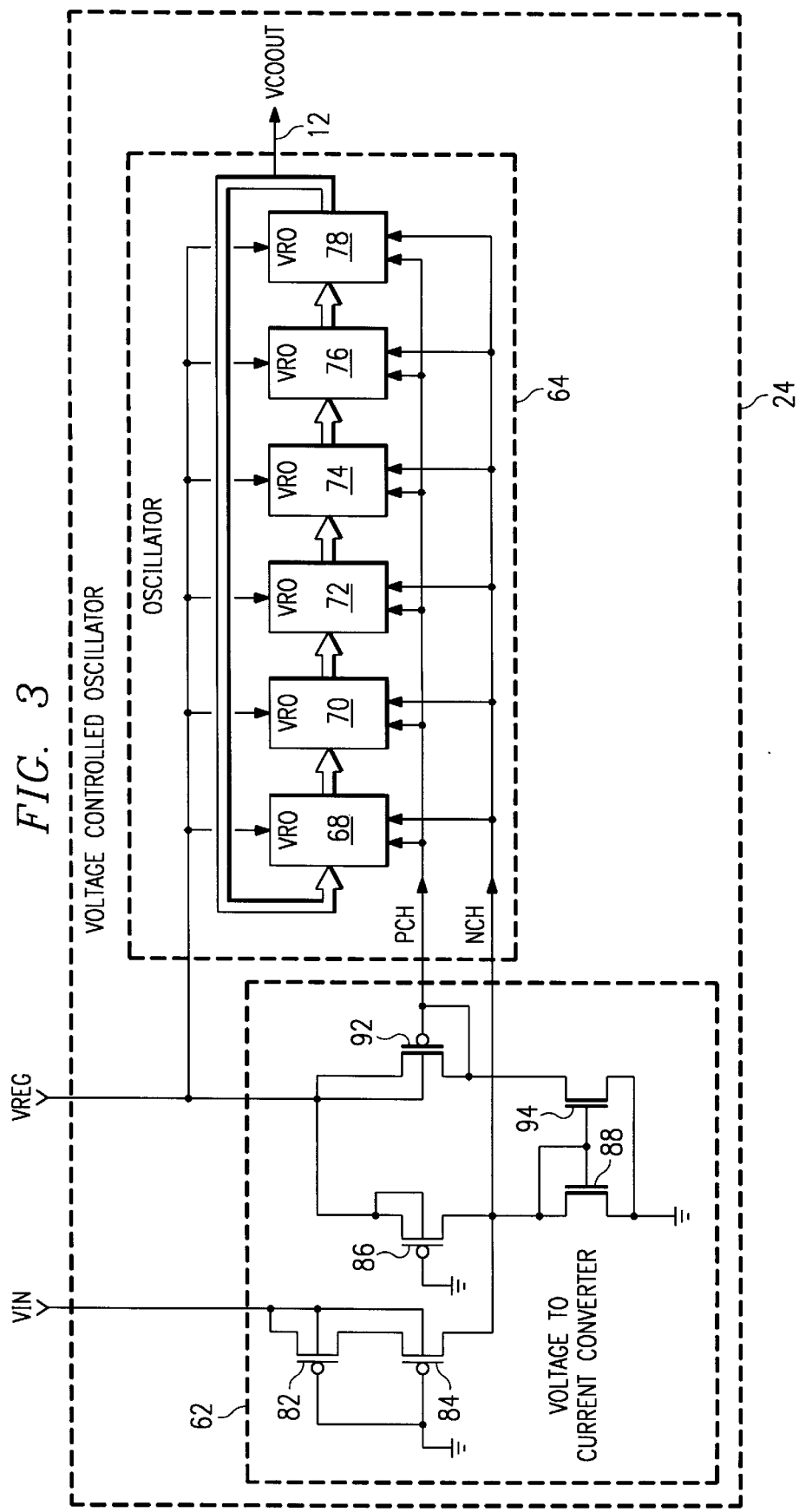
FIG. 3 is a block diagram of voltage controlled oscillator which is a component of the circuit of FIG. 1.

FIG. 1 is a block diagram of an analog phase-locked loop (APLL) which embodies the present invention and which is designated by reference number 10. The phase-locked loop 10 produces at 12 an output signal VCOOUT that is phase and frequency locked to a reference clock 28. The phase-locked loop 10 includes a phase detector circuit 16, a charge pump circuit 18, a loop filter circuit 20, a regulator circuit 22, and a voltage controlled oscillator (VCO) circuit 24.

The circuitry within the phase detector circuit 16 and the charge pump circuit 18 is not itself the focus of the present invention, and each may be implemented with known circuitry. The circuitry within the phase detector circuit 16 and the charge pump circuit 18 is therefore not disclosed in detail. Nevertheless, in order to facilitate a clear and complete understanding of the present invention, the function of each is briefly explained below.

The phase detector circuit 16 has two inputs. The output 12 of the phase-locked loop 10 is applied to one of the inputs, and a reference clock 28 is applied to the other input. The reference clock 28 may be provided by a circuit external to the phase-locked loop 10, and may have a frequency which changes, or may be a fixed-frequency signal provided by a high precision oscillator located inside or outside the phase-locked loop 10. The phase detector 16 compares leading edges of the reference clock 28 to leading edges of the VCO output signal 12, in order to determine whether they are in phase.

The phase detector circuit 16 has two outputs 30 and 32. The output signal 30 is a pump up signal PMPUP, which instructs the charge pump circuit 18 to pump up the charge on a capacitor 36 of the loop filter 20, whereas the output signal 32 is a pump down signal PMPDN, which instructs the charge pump circuit 18 to pump down the charge on the capacitor 36 of loop filter 20.

If the leading edge of the reference clock 28 has a phase lead with respect to the leading edge of the VCOOUT signal 12, then the output 32 is actuated for a short predetermined interval of time and the output 30 is actuated for a longer interval of time. The duration of the actuation of the output 30 exceeds the predetermined time interval by an amount which is proportional to the magnitude of the phase difference between signals 12 and 28. Since the actuation of the output 30 is longer than the actuation of the output 32, the amount of charge which is supplied to the capacitor 36 in response to the actuation of output 30 exceeds the amount of charge which is removed from the capacitor 36 in response to the actuation of output 32, and there is a net increase in the charge on the capacitor 36.

On the other hand, the opposite is true if the leading edge of the reference clock 28 has a phase lag with respect to the leading edge of the VCOOUT signal 12. More specifically, the output 30 is actuated for the short predetermined interval of time, and the output 32 is actuated for a longer interval of time. The duration of the actuation of the output 32 exceeds the predetermined time interval by an amount which is proportional to the magnitude of the phase difference between signals 12 and 28. Since in this case the actuation of the output 32 is longer than the actuation of the output 30, the amount of charge which is removed from the capacitor 36 in response to the actuation of output 32 exceeds the amount of charge which is supplied to the capacitor 36 in response to the actuation of output 30, and there is a net decrease in the charge on the capacitor 36.

In the event that the leading edges of the signals 28 and 12 are in phase with each other, the outputs 30 and 32 are both actuated for the predetermined interval of time. Consequently, the amount of charge which is removed from the capacitor 36 in response to the actuation of output 32 is substantially the same as the amount of charge which is supplied to the capacitor 36 in response to the actuation of output 30, and thus there is no net change in the charge on the capacitor 36.

The charge pump produces at 38 an output signal LFVIN, which is a loop filter input voltage and is coupled to an input of the loop filter circuit 20. The signal LFVIN is also coupled to an output of the loop filter circuit 20, which in turn is coupled to an input of the regulator circuit 22. The capacitor 36 of the loop filter circuit 20 has its ends respectively coupled to ground and to the loop filter input voltage LVFIN at 38. Further, the loop filter circuit 20 includes a resistor 40 having one End coupled to the loop filter input voltage LVFIN at 38, and its other end coupled to one end of another capacitor 42, the other end of the capacitor 42 being coupled to ground. A node between the resistor 40 and capacitor 42 serves as a loop filter signal LF which is designated by reference numeral 44, and which is coupled to the regulator circuit 22.

The regulator circuit 22 has two inputs to which are respectively applied the signals LFVIN and LF, which respectively appear on lines 38 and 44. Further, the regulator circuit 22 has two outputs on which it generates respective voltages VIN and VREG. The internal circuitry of the regulator circuit 22 is described in more detail later.

The voltage controlled oscillator circuit 24 has two inputs to which are respectively applied the output voltages VIN and VREG from the regulator circuit 22. The output voltage VREG from the regulator circuit 22 is also applied to a supply voltage input VRO of the voltage controlled oscillator 24. The voltage controlled oscillator 24 produces an output signal, which serves as the output signal VCOOUT of the phase-locked loop 10.

The circuitry within the regulator circuit 22 will now be described in more detail with reference to FIG. 2. More specifically, the regulator circuit 22 includes a regulating transistor 46 which is an n-channel FET. The source of the transistor 46 is coupled to the output VREG of the regulator circuit 22, and the gate serves as a control input which is coupled to the input LF of the regulator circuit 22. A further regulating transistor 48 is also an n-channel FET, and has its source coupled to the output VIN of the regulator circuit 46. The gate of the transistor 48 serves as a control input which is coupled to the input LFVIN of the regulator circuit 22. The drain of transistor 48 is coupled to the drain of transistor 46.

A further regulating transistor 50 is an n-channel FET, has its source coupled to the drains of the transistors 46 and 48, and has its drain coupled to a supply voltage VCC. The gate of the transistor 50 is coupled to a circuit section 54. The circuit section 54 biases the gate so that transistor 50 is turned on, and also serves as an RC filter which attempts to prevent noise on the supply voltage VCC from being applied to the gate of the transistor 50. The circuit section 54 further includes a transistor 56 which is a p-channel FET having its source coupled to the supply voltage VCC and its drain coupled to the gate of transistor 50. The gate of transistor 56 is coupled to ground, so that the transistor 56 effectively serves as a resistor in the regulator circuit 22. The circuit section 54 also includes a capacitor 58, which has one end coupled to the gate of transistor 50 and its other end coupled to ground.

In the disclosed embodiment, the regulating transistors 46 and 48 are designed or selected so that the transistor 46 has a higher current density than the transistor 48. Thus, the regulator circuit 22 will be more sensitive to variations in the input voltage LF than the input voltage LFVIN. However, the transistors 46 and 48 can be designed or selected so that they have equal current densities, or so that the transistor 48 has a higher current density than transistor 46. Coupling the transistor 50 in series with each of the transistors 46 and 48 yields two levels of isolation from the supply voltage VCC. The biasing and filtering circuit section 54 serves to improve the isolation provided by the transistor 50.

The overall gain of the regulator circuit 22 is relatively low, and in particular is about −35 dB, the transistor 50 contributing about −10 dB of gain, and the transistor 46 or transistor 48 contributing about −25 dB of gain. Since the p-channel transistor 56 effectively acts as a resistor rather than a transistor, it will be noted that the regulator circuit 22 is implemented with just n-channel transistors, namely transistors 46, 48 and 50.

The circuitry of the voltage controlled oscillator circuit 24 (FIG. 1) will now be described in more detail with reference to FIG. 3. More specifically, the voltage controlled oscillator circuit 24 includes a voltage to current converter circuit 62, and an oscillator circuit 64. The oscillator circuit 64 includes a plurality of stages 68, 70, 72, 74, 76 and 78, which are connected in series with each other in an endless loop or ring. The output signal VCOOUT of the voltage controlled oscillator circuit 24 is an output of the stage 78 of the oscillator circuit 64. Each of the stages 68, 70, 72, 74, 76 and 78 has a propagation delay which varies as a function of each of two input signals PCH and NCH. The frequency of the output signal VCOOUT from the oscillator circuit 64 is determined by the speed with which a signal can propagate around the entire ring or loop, or in other words through all of the stages. Thus, as the propagation delay through the stages changes, the output frequency changes. The signal VREG from the regulator circuit 22 is coupled to the oscillator circuit 64, and in particular is coupled to a regulated oscillator supply voltage input VRO for each of the stages 68, 70, 72, 74, 76 and 78.

Although the oscillator circuit 64 shown in FIG. 3 has six stages, it will be recognized that a larger or smaller number of stages could be provided. The particular circuitry within each stage is not the focus of the present invention. Nevertheless, for completeness, one example of a circuit suitable for one of these oscillator stages is shown in FIG. 4. In FIG. 4, the outputs A and B from the illustrated oscillator stage would be coupled respectively to the inputs C and D of the next oscillator stage.

In FIG. 3, the voltage to current converter circuit 62 has two inputs, to which are respectively applied the signals VIN and VREG from the regulator circuit 22. The voltage to current converter circuit 62 generates two outputs PCH and NCH, which are connected to the oscillator circuit 64, and in particular to each of the stages 68, 70, 72, 74, 76 and 78 within the oscillator circuit 64.

The circuitry within the voltage to current converter circuit 62 includes two p-channel transistors 82 and 84, which are connected in series between the input VIN and the output NCH. In particular, the transistor 82 has its source and an n-well contact coupled to the input signal VIN. The gate of transistor 82 is coupled to ground. The transistor 84 has its source coupled to the drain of transistor 82, has an n-well contact coupled to the input signal VIN, has its drain coupled to the output NCH, and has its gate coupled to ground. The voltage to current converter circuit 62 includes a further p-channel transistor 86, which has its source and an n-well contact coupled to the input signal VREG, which has its drain coupled to the output NCH, and which has its gate coupled to ground.

The transistors 82, 84 and 86 all function as resistors. The resistance defined by transistors 82 and 84 determines the current which flows in response to the input voltage VIN, and the resistance defined by transistor 86 determines the current which flows in response to the input voltage VREG. In the disclosed embodiment, the two transistors 82 and 84 provide an effective total resistance which is larger than the effective resistance provided by the transistor 86. Consequently, the signal VIN has less effect on the outputs of the circuit 62 than the input VREG. However, it is alternatively possible that the effective resistance for the input VREG could be equal to or greater than the effective resistance for the input VIN.

The voltage to current converter circuit 62 further includes an n-channel transistor 88 having its drain and gate coupled to the output NCH, and having its source coupled to ground. Because the drain and gate are coupled together, the transistor 88 effectively functions as a diode which has its cathode coupled to ground and its anode coupled to the output NCH.

The voltage to current converter circuit 62 also includes a p-channel transistor 92 having its source and an n-well contact coupled to the input VREG, and having its gate and drain each coupled to the output PCH. Because the gate and drain are coupled to each other, the transistor 92 effectively functions as a diode which has an anode coupled to the input VREG and a cathode coupled to the output PCH. The voltage to current converter circuit 62 further includes an n-channel transistor 94 having its drain coupled to the output PCH and its source coupled to ground, and having its gate coupled to the output NCH. The voltage at the output NCH sets the current through the diode defined by transistor 88. Since the gates of transistors 88 and 94 are coupled together, the current through transistor 88 is mirrored in transistor 94.

FIG. 5 is a block diagram of an integrated circuit 100, which has implemented therein the analog phase-locked loop 10 of FIG. 1, and which also has implemented therein some other circuitry 102. The other circuitry 102 is not illustrated and described, but can be any types of circuitry commonly used in conjunction with an analog phase-locked loop. The other circuitry 102 provides the reference clock signal 28 to the analog phase-locked loop circuit 10, and receives from the analog phase-locked loop circuit 10 its output VCOOUT on line 12. The integrated circuit has a plurality of external connection pins or terminals 104 and 106, which are coupled to the other circuitry 102. The external connection pins 104 are inputs to the integrated circuit 100, and the external connection pins 106 are outputs from the integrated circuit 100. In the integrated circuit 100 of FIG. 5, the analog phase-locked loop circuit 10 is free of connections to the external connection pins 104 and 106. For example, none of the external connection pins 104 and 106 are used to provide connections from the phase-locked loop circuit 10 to a regulated supply voltage and an associated ground, or to a loop filter circuit external to the integrated circuit 100.

With reference to FIG. 3, the frequency of the voltage controlled oscillator circuit 24 is changed by increasing or decreasing the voltage across and the current flowing through the diode defined by the n-channel transistor 88. The voltage across the transistor 88, which is the signal NCH, is in turn increased or decreased by increasing or decreasing the voltage at either of the two inputs VIN or VREG. Since the n-channel transistor 94 forms a current mirror with the transistor 88, the current through transistor 94 changes when the current through transistor 88 changes, which in turn changes the signal PCH that is the voltage across transistor 94 and the voltage at the gate of transistor 92. When the voltage of the signal NCH increases, the voltage of the signal PCH decreases. Transistor 88 forms a respective current mirror with a transistor in each of the oscillator stages 68, 70, 72, 74, 76 and 78, which in the stage 72 is the lowermost transistor in FIG. 4. Transistor 92 form, a respective current mirror with each of two transistors in each oscillator stage, which in the stage 72 are the two uppermost transistors in FIG. 4. When NCH increases and PCH decreases, the current flowing through each of the oscillator stages increases, which has the effect of increasing switching speeds and thus reducing propagation delays through the oscillator stages, and thus increasing the oscillator frequency. Conversely, when NCH decreases and PCH increases, the current flowing through each of the oscillator stages decreases, which has the effect of decreasing switching speeds and thus increasing propagation delays through the oscillator stages, and thus decreasing the oscillator frequency.

The gain of the VREG input is set through selection of the effective resistance provided by the p-channel transistor 86, and the gain of the VIN input is set through selection of the effective resistance provided by the two p-channel transistors 82 and 84. In the disclosed embodiment, the resistance defined by the transistors 82 and 84 is twice the resistance defined by the transistor 86, as a result of which the voltage change required at VIN to effect a given change in the voltage across the transistor 88 is twice the voltage change required at VREG to effect the same voltage change. Thus, since about one-third of the current flowing through the transistor 88 comes from the VIN input and about two-thirds comes from the VREG input, the Hertz/volt gain of the VIN input is about one-third of the Hertz/volt gain of the NCH signal, and the Hertz/volt gain of the VREG input is about two-thirds of the Hertz/volt gain of the NCH signal.

The higher gain VREG input is coupled through the regulator circuit 22 to the loop filter voltage at 44, which is more stable than the loop filter voltage at 38, whereas the lower gain VIN input is coupled through the voltage regulator circuit 22 to the more volatile loop filter voltage at 38. The provision of the dual inputs VIN and VREG contributes to reduced jitter in the analog phase-locked loop 10, in comparison to known analog phase-locked loop circuits. Reduced jitter means in turn that the analog phase locked loop circuit 10 is capable of stable operation across a wider frequency range than known analog phase-locked loop circuits. The voltage controlled oscillator 24 is capable of stable operation with minimal jitter across a frequency range that has an upper end frequency which is at least 250 times the lower end frequency. This frequency range is several times the frequency range of known voltage controlled oscillator circuits for analog phase-locked loop circuits. The circuitry of the voltage controlled oscillator 24 also requires a lower voltage overhead than known voltage controlled oscillators for analog phase locked loops, and the voltage controlled oscillator 24 can thus work with a lower regulated voltage.

The voltage regulator circuit shown in FIG. 2, which includes n-channel transistors 46, 48 and 50, also provides good noise rejection between the supply voltage VCC and the signals VREG and VIN, which further contributes to reduced jitter. More specifically, the transistor 50 is configured as an n-channel source follower, and thus the source voltage tracks the gate voltage. Since the gate voltage is filtered by the circuit section 54, the source of transistor 50 is isolated from VCC by the filtering effect of circuit section 54, which in turn represents isolation between VCC and the signals VREG and VIN. The n-channel transistors 46 and 48, which are also configured as source followers, have their gates coupled to the filter voltages at 44 and 38, respectively, and thus act to further isolate VREG and VIN from the supply voltage VCC. The noise rejection of the voltage regulator 22 contributes to a low gain, in particular a gain as low as −34 dB. Through the use of n-channel devices in the voltage regulator 22, the control voltages produced by the voltage regulator 22 are in phase with the control voltages required by the voltage controlled oscillator 24, resulting in better control. The noise rejection of the voltage regulator circuit 22 and the wide frequency range provided by the two-input voltage controlled oscillator circuit 24 permit greater freedom in noise versus frequency tradeoffs during design of an analog phase-locked loop embodying the invention.

Because the voltage controlled oscillator 24 has a wide frequency range, it is not necessary to use staging techniques. In other words, it is not necessary to provide supplemental oscillator stages which are similar to the stage 72 of FIG. 4, which are in addition to the stages 68, 70, 72, 74, 76 and 78 of FIG. 3, and which can be selectively switched into and out of the endless ring of stages shown in FIG. 3 in order to change the frequency of the voltage controlled oscillator. By avoiding the need for such supplemental oscillator stages, the area required to implement the voltage controlled oscillator circuit 24 in an integrated circuit is less than that for known circuits, which means reduced size and power consumption for the integrated circuit. In particular, the analog phase-locked loop according to the invention uses less than one-half the area and consumes less than one-fifth of the power of known analog phase-locked loop circuits. Moreover, all of the current flowing through the voltage regulator circuit 22 also flows through the voltage controlled oscillator circuit 24. Consequently, the power consumed by the series-coupled voltage regulator circuit 22 and voltage controlled oscillator circuit 24 is about the same as the power which would be consumed by just the voltage controlled oscillator circuit 24 if the voltage regulator circuit 22 were omitted (in favor of regulated voltages from a regulator external to the integrated circuit). Therefore, when the voltage regular circuit 22 is included, there is no increase in the total power consumption of the analog phase-locked loop circuit 10.

Due to the excellent isolation from VCC which is provided by the voltage regulator circuit 22, the voltage regulator circuit 22 provides a regulated voltage output which is sufficiently stable to power the voltage controlled oscillator. The analog phase-locked loop circuit 10 can thus operate using the supply voltage VCC provided to the rest of the integrated circuit, without any need for a regulated supply voltage and associated ground from another regulator circuit. Therefore, unless some other circuitry within the integrated circuit needs a regulated supply voltage and associated ground, it is not necessary to dedicate any external connection pins to a regulated supply voltage and ground from an external regulator circuit.

The present invention provides numerous technical advantages. One such technical advantage is the capability for stable operation with minimal jitter across a wide frequency range, which is significantly greater than the useable frequency range of known techniques. A wide frequency range is realized in combination with a low gain. Also, there is more freedom in noise versus frequency tradeoffs during design. A further advantage is that, as to implementation in an integrated circuit, the analog phase-locked loop of the present invention does not need external connection pins of the integrated circuit for a regulated supply voltage and an associated ground, or for an external filter circuit. Yet another advantage, in the context of implementation in an integrated circuit, is that the analog phase-locked loop of the present invention uses less than one-half the area and consumes less than one-fifth the power of known designs.

Although one embodiment has been illustrated and described in detail, it should be understood that various changes, substitutions and alterations can be made therein without departing from the scope of the present invention. For example, although the disclosed regulator circuit receives two inputs from the loop filter circuit and generates two outputs to the voltage controlled oscillator, the present invention would encompass a voltage regulator circuit which receives a single input and, generates a single output, which receives a single input and generates two or more outputs, or which receives two or more inputs and generates a single output. Further, although the disclosed voltage controlled oscillator receives a regulated supply voltage from the regulator circuit, it would be possible to provide the voltage controlled oscillator with a regulated supply voltage from a different circuit. Moreover, although the disclosed loop filter circuit includes two capacitors and ore resistor, variations of the loop filter circuit are possible without departing from the scope of the present invention.

It should also he recognized that direct connections disclosed herein could be altered, such that two disclosed components or elements are coupled to one another through an intermediate device or devices without being directly connected, while still realizing the present invention. Other changes, substitutions and alternations are also possible without departing from the spirit and scope of the present invention, as defined by the following claims.

What is claimed is:

1. An apparatus comprising:
   an analog phase-locked loop circuit having an output terminal, said analog phase-locked loop circuit including:
   a phase detector circuit coupled to said output terminal, and operable to detect a phase relationship between a reference signal and a signal at said output terminal, and to output charge pump control information representative of said phase relationship;
   a loop filter circuit which includes a capacitor;
   a charge pump circuit coupled to said phase detector circuit and said loop filter circuit, said charge pump circuit being responsive to said charge pump control information from said phase detector circuit and being operable to respectively increase and decrease a charge on said capacitor when said charge pump control information indicates that one of the reference signal and the signal at said output terminal respectively has a phase lead and a phase lag with respect to the other thereof;
   a voltage regulator circuit having an input coupled to said loop filter circuit, said voltage regulator circuit being operable to output oscillator control information which is varied as a function of a voltage at said input to said voltage regulator circuit; and
   a voltage controlled oscillator circuit responsive to said oscillator control information from said voltage regulator circuit and having an output which is coupled to said output terminal of phase-locked loop circuit, said voltage controlled oscillator circuit being operable to produce at said output thereof a signal having a frequency which varies as a function of said oscillator control information.

2. An apparatus according to claim 1, wherein said voltage regulator circuit has a further input coupled to said loop filter circuit, said voltage regulator circuit being operable to vary said oscillator control information as a function of voltages at each of said inputs thereof.

3. An apparatus according to claim 1,
   wherein said voltage controlled oscillator circuit has first and second inputs;
   wherein said voltage regulator circuit has a further input coupled to said loop filter circuit, and is operable to output first and second oscillator control voltages which are respectively applied to said first and second inputs of said voltage controlled oscillator circuit and which are respectively varied as a function of voltages respectively present at said two inputs of said voltage regulator circuit, said oscillator control information including each of said first and second oscillator control voltages; and
   wherein said voltage controlled oscillator circuit is operable to vary the frequency of the signal at said output thereof as a function of said voltages at each of said first and second inputs thereof.

4. An apparatus according to claim 1,
   wherein said voltage controlled oscillator circuit has first and second inputs;
   wherein said capacitor of said loop filter circuit is coupled between ground and said input of said voltage regulator circuit;
   wherein said loop filter circuit includes a resistor having a first end coupled to said input of said voltage regulator circuit and having a second end, and includes a further capacitor coupled between ground are said second end of said resistor;
   wherein said voltage regulator circuit has a further input which is coupled to said second end of said resistor, said voltage regulator circuit being operable to output first and second oscillator control voltages which are respectively applied to said first and second inputs of said voltage controlled oscillator circuit and which are respectively varied as a function of voltages present at respective said inputs of said voltage regulator circuit, said oscillator control information including each of said first and second oscillator control voltages; and
   wherein said voltage controlled oscillator circuit is operable to vary the frequency of the signal at said output thereof as a function of said voltages at said first and second inputs thereof.

5. An apparatus according to claim 4,
   wherein said voltage controlled oscillator circuit has a supply voltage input; and
   wherein one of said first and second oscillator control voltages is coupled to said supply voltage input of said voltage controlled oscillator circuit.

6. An apparatus according to claim 1, including an integrated circuit having a plurality of external connection pins, said integrated circuit having said analog phase-locked loop circuit and other circuitry implemented therein, said output terminal of said analog phase-locked loop circuit being coupled to said other circuitry, and said integrated circuit being free of connections between said analog phase-locked loop circuit and said external connection pins.

7. An apparatus comprising:
   an analog phase-locked loop circuit having an output terminal, said analog phase-locked loop circuit including:
   a phase detector circuit coupled to said output terminal, and operable to detect a phase relationship between a reference signal and a signal at said output terminal, and to output charge pump control information representative of said phase relationship;
   a loop filter circuit which includes a first capacitor having a first end coupled to ground and having a second end, a second capacitor having a first end coupled to ground and having a second end, and a resistor having a first end which is coupled to said second end of said first capacitor, and having a second end which is coupled to said second end of said second capacitor;

a charge pump circuit coupled to said phase detector circuit and to said second end of said first capacitor, said charge pump circuit being responsive to said charge pump control information from said phase detector circuit and being operable to respectively increase and decrease a charge on said first capacitor when said charge pump control information indicates that one of the reference signal and the signal at said output terminal respectively has a phase lead and a phase lag relative to the other thereof;

a voltage regulator circuit having first and second inputs respectively coupled to said second end of said first capacitor and said second end of said second capacitor, and having first and second outputs, said voltage regulator circuit being operable to output first and second oscillator control voltages respectively at said first and second outputs thereof, said voltage regulator circuit being operable to respectively vary said first and second oscillator control voltages as a function of voltages present respectively at said first and second inputs of said voltage regulator circuit; and a voltage controlled oscillator circuit having two control voltage inputs respectively coupled to said first and second outputs of said voltage regulator circuit, having a supply voltage input coupled to said second output of said voltage regulator circuit, and having an output which is coupled to said output terminal of said phase-locked loop circuit, said voltage controlled oscillator circuit being operable to produce at said output thereof a signal having a frequency which varies as a function of each of said first and second oscillator control voltages.

8. An apparatus according to claim 7, including an integrated circuit having a plurality of external connection pins, said integrated circuit having said analog phase-locked loop circuit and other circuitry implemented therein, said output terminal of said analog phase-locked loop circuit being coupled to said other circuitry, and said integrated circuit being free of connections between said analog phase-locked loop circuit and said external connection pins.

9. A method for effecting analog phase-locked loop control of a frequency of a specified signal, comprising the steps of:

detecting a phase relationship between the specified signal and a reference signal;

generating charge control information representative of the detected phase relationship between the specified signal and the reference signal;

respectively increasing and decreasing a charge on a loop filter capacitor when the charge control information indicates that one of the specified and reference signals respectively has a phase lead and a phase lag relative to the other thereof;

applying to an input of a voltage regulator circuit a voltage derived from the voltage on the capacitor;

causing the voltage regulator circuit to output oscillator control information which is varied as a function of the voltage at the input to the voltage regulator circuit;

supplying the oscillator control information to a voltage controlled oscillator circuit; and causing the voltage controlled oscillator circuit to output a signal which is the specified signal and which has a frequency that is varied as a function of the oscillator control information.

10. A method according to claim 9, including the steps of:

providing a resistor and a further capacitor which are coupled in series with each other across the loop filter capacitor;

applying to a further input of the voltage regulator circuit a voltage which is derived from a voltage on the further capacitor; and causing the voltage regulator circuit to vary the oscillator control information as a function of the respective voltages at each of the inputs to the voltage regulator circuit.

11. A method according to claim 9, including the steps of:

providing a resistor and a further capacitor which are connected in series with each other across the loop filter capacitor;

applying to a further input of the voltage regulator circuit a voltage which is derived from a voltage on the further capacitor;

causing the voltage regulator circuit t0 output first and second oscillator control signals which are respectively varied as a function of changes in the voltages respectively present at the two inputs of the voltage regulator circuit, the oscillator control information including each of the first and second oscillator control signals;

applying to first and second inputs of the voltage controlled oscillator circuit the first and second oscillator control signals, respectively; and causing the voltage controlled oscillator circuit to vary the frequency of the specified signal as a function of each of the first and second oscillator control signals.

12. A method according to claim 11, including the step of: applying the second oscillator control signal to a supply voltage input of the voltage controlled oscillator circuit.

* * * * *